United States Patent [19]

Hamada et al.

[11] Patent Number: 4,745,611
[45] Date of Patent: May 17, 1988

[54] BURIED TWIN RIDGE SUBSTRATE LASER

[75] Inventors: Ken Hamada, Toyonaka; Kunio Itoh, Uji; Masahiro Kume; Takao Shibutani, both of Takatsuki; Hirokazu Shimizu, Suita, all of Japan

[73] Assignee: Matsushita Electric Industrial Co., Ltd., Kadoma, Japan

[21] Appl. No.: 922,654

[22] Filed: Oct. 24, 1986

[30] Foreign Application Priority Data

Oct. 25, 1985 [JP] Japan ................................ 60-239857
Dec. 17, 1985 [JP] Japan ................................ 60-283411

[51] Int. Cl.$^4$ .............................................. H01S 3/19
[52] U.S. Cl. ............................ 372/45; 372/46; 357/17
[58] Field of Search ................ 372/44, 45, 46, 48; 357/17

[56] References Cited

FOREIGN PATENT DOCUMENTS 0222984 12/1984 Japan ................................ 372/48
0001880 1/1985 Japan ................................ 372/45
0014486 1/1985 Japan ................................ 372/45

Primary Examiner—James W. Davie
Assistant Examiner—Georgia Y. Epps
Attorney, Agent, or Firm—Cushman, Darby & Cushman

[57] ABSTRACT

A BTRS (buried Twin-Ridge Substrate) structure laser, wherein an oblong protrusion (10) is provided on a substrate (1) of a first conductivity type and two ridges (9, 9) divided by a groove (31) therebetween are provided on a second layer (2) of a second conductivity type, and thereon plural layers (3, 4, 5, 6) including an active layer (4) are provided is improved to have longer service life such that: the protrusion (10) is shortened so as to have its both ends apart inside cavity facet of the substrate (1), or further by width of each ridge (9, 9) is narrowed at both ends thereof thereby forming narrowed end parts (9', 9'), so that excessive current injection to the active layer near the cavity facet is eliminated.

7 Claims, 6 Drawing Sheets

BURIED TWIN RIDGE SUBSTRATE LASER

FIELD OF THE INVENTION AND RELATED ART STATEMENT

1. Field of the Invention

The present invention relates generally to a semiconductor laser device, and particularly concerns a semiconductor laser which is capable of outputting fundamental lasing mode and has a cavity facet durable to deterioration.

2. Description of the Related Art

Recently, more attention is being paid to the semiconductor laser device as a most essential device of optoelectronic industry or use as a signal on a optical disk or CD, a light source of laser beam printer, light source or optical communication, etc.

In these opto-information apparatuses, demand of laser light output has been mostly 10-20 mW or the lower. However, in recent years, demands or higher output laser devices (20 mW or larger) for uses in recording and erasing of optical disk, high speed operation of laser beam printer, medical surgery operation, etc. is increasing.

There are two major obstacles in obtaining high output of the semiconductor laser. The first one is that when output is increased, liability of opto-electric transverse mode propagating in the crystal shifts from the fundamental mode to higher modes as the optical density increases. When the oscillation is made in the higher mode, intensity distribution of the laser beam becomes a multi-peaked shape instead of a single peak shape, thereby making an obstacle for actual use. A second one is that as the light density increases at both cavity facets faces of the laser crystal, deterioration of the crystal near the cavity facet becomes liable, thereby to shorten the life of the semiconductor laser device. It is reported that in the lasing region at the part near the cavity facet of the laser crystal, the temperature becomes locally above 200° C., (Journal of Applied Physics 58, p. 1124, 1985). Such local heating accelerate generator of undesirable dislocation of crystal, and such dislocation further accelerates heat generation by absorbing the laser light therein as non-lasing center, thus making repeated thermal bursts which shorten the life of the semiconductor laser device.

SUMMARY AND OBJECT OF THE INVENTION

Purpose of the present invention is to provide an improved semiconductor laser capable of lasing with fundamental mode at a high output state.

Another purpose of the present invention is to provide the improved laser wherein heat generation near the cavity facet is small, thereby preventing thermal destruction of the cavity facet, thus to realize a semiconductor laser of long life time.

These and other objects are accomplished by a semiconductor laser comprising a semiconductor substrate of a first conductivity type having, on a principal face thereof, a protrusion of stripe shape, the protrusion having end faces in inside parts of cavity facets, a first semiconductor layer of a second conductivity type formed on the principal face, having two ridge parts which have a groove therebetween, whose bottom does reach the upper face of the protrusion at the part on the protrusion but does not reach the principal face of the semiconductor substrate and remain in the first semiconductor layer at the part except on the protrusion, the groove being parallel to and over the protrusion, plural layers including an active layer, which are formed on the ridges and on the groove, a first electrode formed on an uppermost layer of the plural layers and a second electrode formed on the other face of the semiconductor substrate.

The semiconductor laser of the above-mentioned constitution can oscillate with fundamental mode at a high output oscillation state.

Further, the semiconductor laser of the present invention can serve for long life time as a result of elimination of thermal destruction at the cavity facet.

While the novel features of the invention are set forth with particularity in the apended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
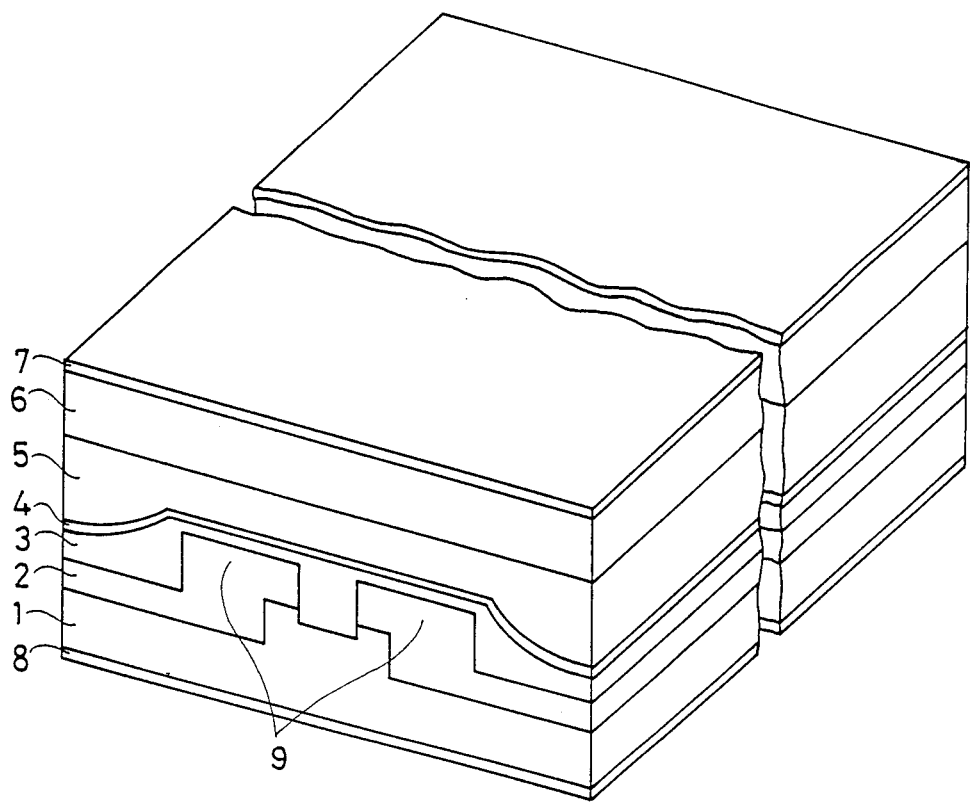
FIG. 1 is the perspective view showing the prior art BTRS semiconductor laser.

FIG. 1 shows an invention made by the present inventors and filed as Japanese Patent Application No. Sho 59-13612, filed Jan. 27, 1984 (Japanese Patent Unexamined Published Application No. Sho 60-158684, laid open Aug. 20, 1985). This type of semiconductor laser is called BTRS (Buried Twin-Ridge Substrate) structure.

The semiconductor laser of the above-mentioned invention comprises on a GaAs substrate 1 having a ridge shaped protrusion 10, a blocking layer 2 which has a groove 21 whose bottom reaching down to the upper face of the ridge shaped protrusion 10, thus making two ridges 9, 9 thereon; and further thereon a first cladding layer 3 of p-type $Ga_{1-y}Al_yAs$ having a flat upper face; a non-doped active layer 4 of $Ga_{1-x}Al_xAs$; a second cladding layer 5 of n-type $Ga_{fl-y}Al_yAs$, and further thereon a contact layer 6 of n+-type GaAs, and upper and lower electrodes 7 and 8. Such BTRS structure semiconductor laser device has very thinly grown active layer 4 as the effect of two parallel ridges 9, 9, thereby to increase spread of lased light to fourth cladding layers 3 and 5. As a result, lasing region in a cross section plane of the laser device is broadened, that is, excessive centerings of high energy density at local points can be prevented, thereby achieving higher light output. However, the above-mentioned BTRS structure does not have any measure against deterioration near cavity facet of the semiconductor laser crystal.

Accordingly, the present invention intends to make a proposal for configuration of the semiconductor laser device to minimize thermal deterioration of the cleaved face of the crystal of the semiconductor laser device.

A preferred embodiment of the present invention is elucidated with reference to FIG. 2(a), FIG. 2(b), FIG. 2(C) and FIG. 3.

Figure 2A:
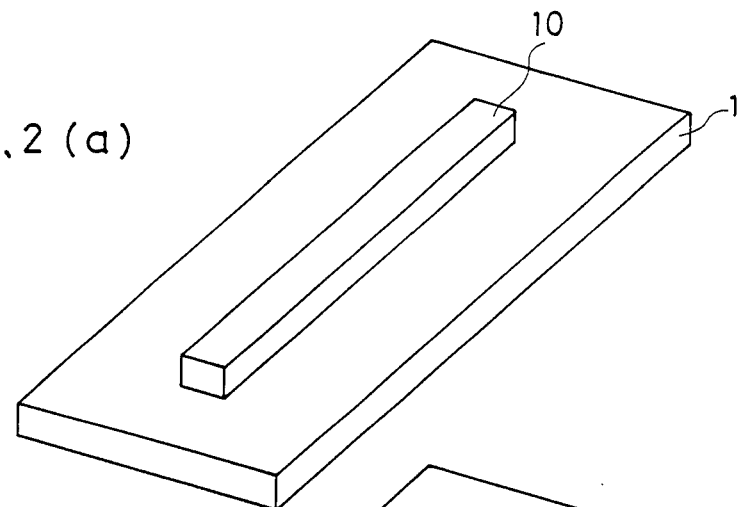
FIG. 2(a), FIG. 2(b) and FIG. 2(c) are perspective views showing manufacturing flow of a first example of the semiconductor laser device of the present invention.
Figure 2B:
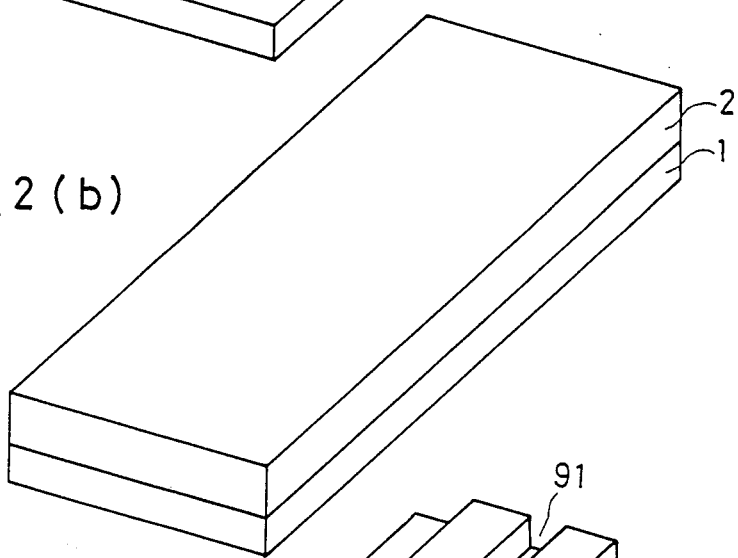
Figure 2C:
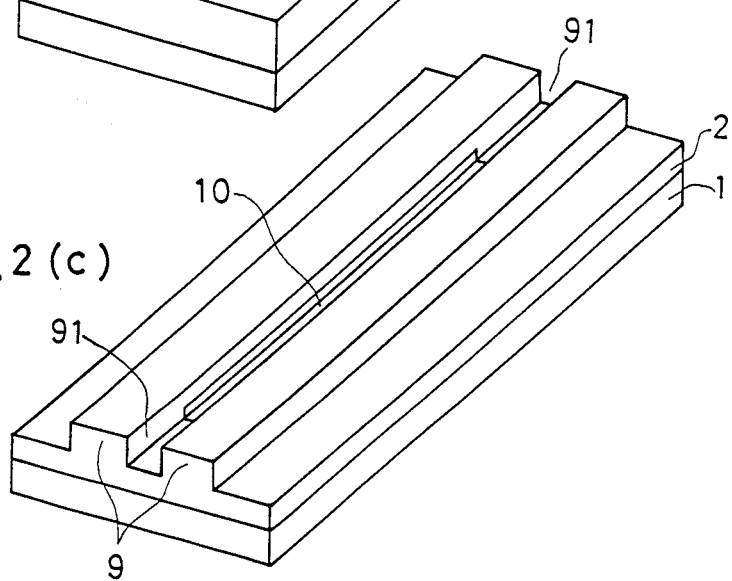

Firstly, a substrate 1 of p-conductivity type having an oblong protrusion 10 of 2 μm height, 12 μm width and 200 μm length, provided in a manner that both end face is offset from the end faces of the substrate 1 is prepared, as shown in FIG. 2(a). On this substrate, a current blocking layer 2 of an n-conductivity type GaAs layer is formed by epitaxial growth to have a flat top face and a thickness of 0.8 μm at the part above the oblong protrusion 10 as shown in FIG. 2(b). The current blocking layer 2 is then etched to form two parallel ridges 9, 9, with a groove 91 of 4 μm width inbetween, as shown in FIG. 2(c). Height of the ridge is 1.5 μm and width of each ridge 9 is 20 μm. The depth of the groove 91 is such that the bottom of the groove 91 reaches the upper face of the oblong protrusion 10, thereby slightly etching the surface of the p-conductivity type substrate 1 at the part on the oblong protrusion 10, while no surface of the substrate 1 appearing at the bottom of the groove 91 at the part over the regions where the oblong protrusion 10 does not exist.

Then, on the upper face of the current blocking layer 2 having the parallel ridges 9, 9, a first cladding layer 3 of p-conductivity type $Ga_{1-y}Al_yAs$ is formed to have a thickness of about 0.3 μm on the part above the ridges 9, 9 as a first layer, and further thereon an active layer 4 of non-doped $Ga_{1-x}Al_xAs$ of about 0.05 μm thickness as a second layer, and still further thereon a second cladding layer 5 of n-conductivity type $Ga_{1-y}Al_yAs$ of about 1.5 μm thickness as a third layer, and finally an electrode-forming layer 6 of n-conductivity type GaAs of about 2 μm are formed by sequential epitaxial growth. In a preferred embodiment, the values of x and y are selected as x=0.08 and y=0.43. And further, on the contact layer 6 and on the bottom face of the substrate 1, an n-side electrode metal layer 7 and a p-side electrode metal layer 8 are formed by vapor depositions, respectively, and further, by making alloying treatment thereof n-side ohmic electrode 7 and p-side ohmic electrode 8 are formed. Then the wafer thus made are cleaved into individual semiconductor laser units. In the cleaving, the positions of the cleaved faces of the resonator are selected to be apart outward from both end faces of the oblong protrusion 10 each by about 25 μm. Thus, a semiconductor laser shown in FIG. 3 is produced.

Figure 3:
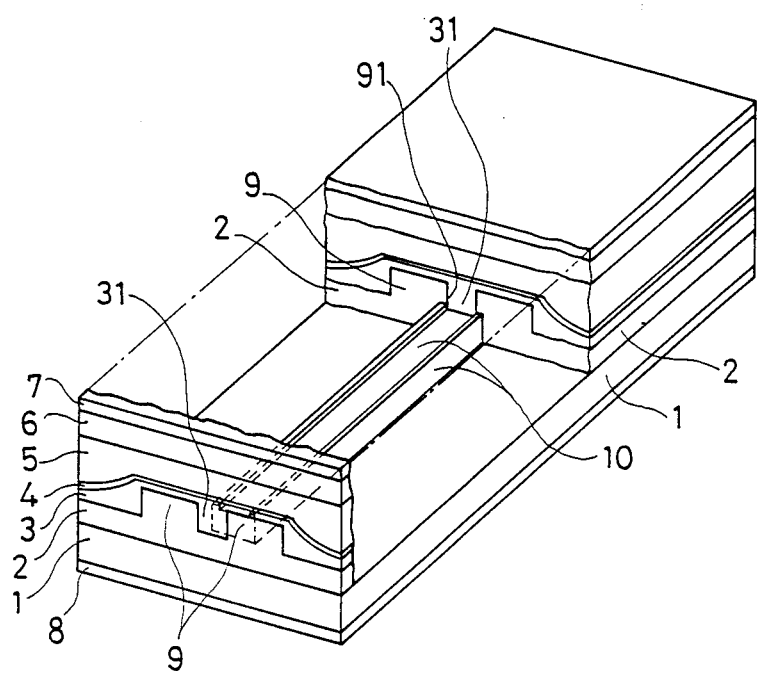
FIG. 3 is a perspective view of a completed semiconductor laser made by the process of FIG. 2(a), FIG. 2(b) and FIG. 2(c).

In the configuration of the above-mentioned embodiment, the mesa, i.e., the protrusion 10 formed on the substrate 1 is made to have its both end faces inside the positions of the cleaved faces of the resonator of the completed laser, as shown in FIG. 3. Accordingly, the bottom face of the groove 31 reaches the substrate 1 only at the part which is above the oblong protrusion 10 and does not reach the substrate 1 at the parts near both cleaved faces of each laser. Therefore, current injected from the substrate 1 to the active layer 4 does not flow into the active layer 4 at the part near the cleaved faces, but flows in the active layer effectively in the part above the oblong protrusion 10. Accordingly, excessive heating of the active layer 4 at the parts near the cleaved end faces due to heating by non-emission transitions can be prevented. By using the semiconductor laser of the above-mentioned embodiment, a high laser output of 180 mW at maximum lasing output is obtained, and in a reliability test wherein the semiconductor laser devices are driven at 50 mW laser output, number of lasers which makes initial deterioration was very small, and substantially the same output power as initial stage is retained even after a long time operation.

A second preferred embodiment is described with reference to the drawings FIG. 4(a) and thereafter.

Figure 4A:
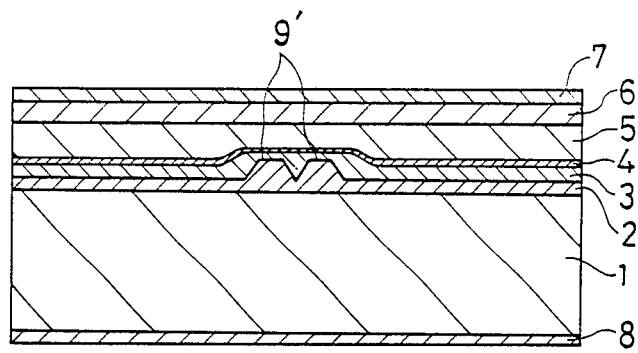
FIG. 4(a) and FIG. 4(b) are sectional views showing sectional configurations of different parts of a second preferred embodiment of the present invention.
Figure 4B:
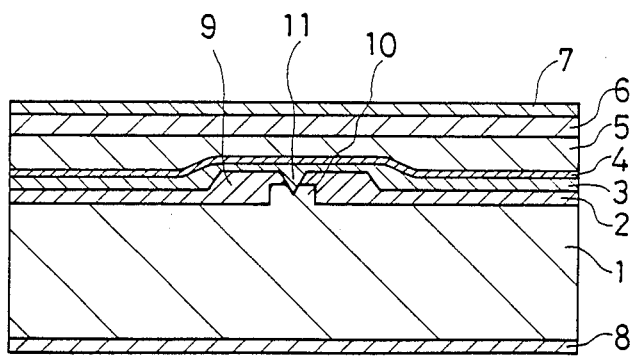

FIG. 4(a) shows sectional configuration at the part of the cleaved face, and FIG. 4(b) shows a sectional configuration at the part inside of the semiconductor laser unit.

Figure 5A:
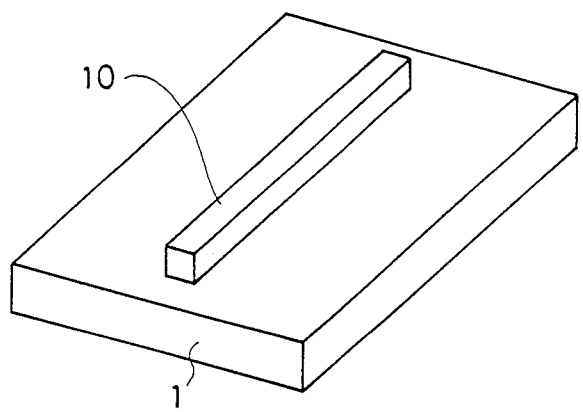
FIG. 5(a), FIG. 5(b) and FIG. 5(c) are perspective views showing manufacturing flow of the second embodiment.
Figure 5B:
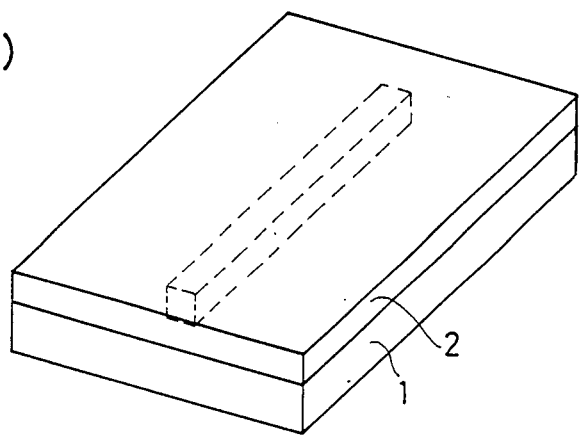
Figure 5C:
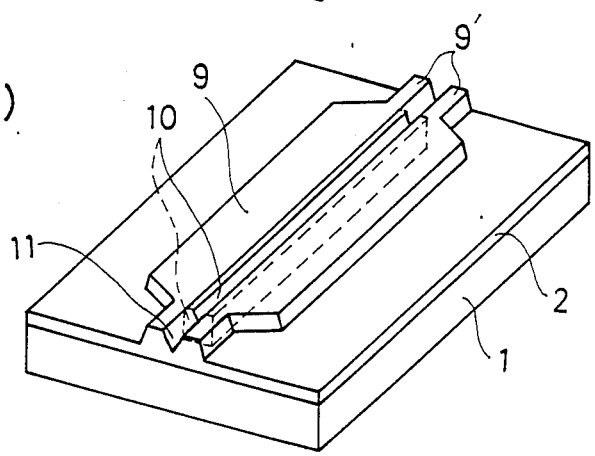

Firstly, a substrate 1 of p-conductivity type having an oblong protrusion 10 of 3 μm height, 10 μm width and 200 μm length, provided in a manner that both end face is offset from the end faces of the substrate 1 is prepared, as shown in FIG. 5(a). On this substrate, a current blocking layer 2 of an n-conductivity type GaAs layer is formed by epitaxial growth to have a flat top face and a thickness of 1.0 μm at the part above the oblong protrusion 10 as shown in FIG. 5(b). The current blocking layer 2 is then etched to form two parallel ridges 9, 9, with a V-sectioned groove 91 of 4 μm width at the top part, inbetween as shown in FIG. 5(c). The ridges 9, 9 of the current blocking layer 2 is provided for enabling thickness control of an active layer to be formed later. That is, the thickness control is made by a phenomenon that crystal growth rate becomes small on such ridge-shaped parts. Heights of the ridge is 1.5 μm and width of each ridge 9 is 20 μm. The depth of the groove 91 is 1.5 μm, so that the bottom of the groove 91 reaches the upper face of the oblong protrusion 10, thereby slightly etching the surface of the p-conductivity type substrate 1 at the part on the oblong protrusion 10, while no surface of the substrate 1 appearing at the bottom of the groove 91 at the part over the regions where the oblong protrusion 10 does not exist. The plan-view shapes of the ridges 9, 9 are made to have narrowed end parts 9', 9' at both ends of respective ridges 9, 9, where no oblong protrusion 10 exists there, while edges of both ridges which are on the groove 11 is made straight. That is, in the example, the width of each ridge 9 on one side of the groove 11 at the center part is 20 μm width, and the width of each narrowed part 9 on one side of the groove 11 is 5 μm.

Then, on the upper face of the current blocking layer 2 having the parallel ridges 9, 9, a first cladding layer 3 of p-conductivity type $Ga_{1-y}Al_yAs$ is formed to have a thickness of about 0.3 μm on the part above the ridges 9, 9 as a first layer, and further thereon an active layer 4 of non-doped $Ga_{1-x}Al_xAs$ of about 0.05 μm thickness at the central part as a second layer, and still further thereon a second cladding layer 5 of n-conductivity type $Ga_{1-y}Al_yAs$ of about 1.5 μm thickness as a third layer, and finally a contact layer 6 of n-conductivity type GaAs of about 2 μm are formed by sequential epitaxial growth. In a preferred embodiment, the values of x and y are selected as x=0.08 and y=0.43. And further, on the contact layer 6 and on the bottom face of the substrate 1, and n-side electrode metal layer 7 and a p-side electrode metal layer 8 are formed by vapor depositions, respectively, and further, by making alloying treatment thereof n-side ohmic electrode 7 and p- side ohmic electrode 8 are formed. Then the wafer thus made are cleaved into individual semiconductor laser units. In the cleaving, the positions of the cleaved faces of the resonator are selected to be apart outward from both end faces of the oblong protrusion 10 each by about 20 μm. Thus, a semiconductor laser having a sectional configuration as shown in FIG. 4(a) and FIG. 4(b) at both end parts and at the central part, respectively, is produced.

In the configuration of the above-mentioned embodiment, the mesa, i.e., the protrusion 10 formed on the substrate 1 is made to have its both end faces inside the positions of the cleaved faces of the resonator of the completed laser, as shown in FIG. 5(a), FIG. 5(b) and FIG. 5(c). Accordingly, the bottom face of the groove 31 reaches the substrate 1 only at the part which is above the oblong protrusion 10 and does not reach the substrate 1 at the parts near both cleaved faces of each laser. Thus, a second liquid phse epitaxial growths are made on the wafer shown by FIG. 5(c), thereby to form the first cladding layer 3 and the active layer 4. In this epitaxial growth process, the growth speed on the ridge parts has such a variety that the speed is slower as the ridge width is narrower. Therefore, the active layer 4 has smaller thickness at the parts near both cleaved faces than the central part of the wafer. Since the thin parts of the active layer does confine less laser light than the thicker central part, diameters of the cross-sections of the laser light beam in the active layer at the parts near the cleaved faces become larger than that at the central part. Accordingly the density of the laser light at both cleaved end faces is desirably decreased. Thus, excessive heating of the active layer 4 at the parts near the cleaved end faces can be prevented. By using the semiconductor laser of the above-mentioned embodiment, a high laser output of 280 mW at maximum lasing output is obtained, and in a reliability test wherein the semiconductor laser devices are driven at 50 mW laser output, number of lasers which makes initial deterioration was very small, and substantially the same output power as initial stage is retained even after a long time operation.

Figure 6:
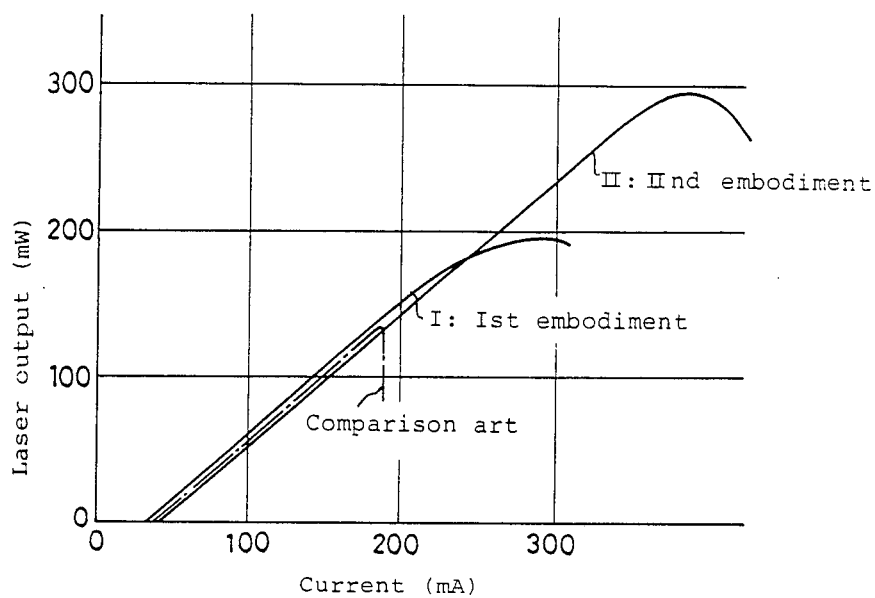
FIG. 6 and FIG. 7 are graphs showing characteristics of the embodiments of the semiconductor laser device of the present invention and prior art.

FIG. 6 is a graph showing curves of current vs. laser light output characteristics of the semiconductor laser in accordance with the Ist embodiment of FIG. 2(a), FIG. 2(c) and FIG. 3 (solid curves I), and the IInd embodiment of FIG. 4 and FIG. 5(a)–FIG. 5(c) of the present invention (solid curves II), and those of comparison art (chain curves C). As shown in FIG. 6, the embodiments of the present invention have prominent increase of saturation laser light output.

Figure 7:
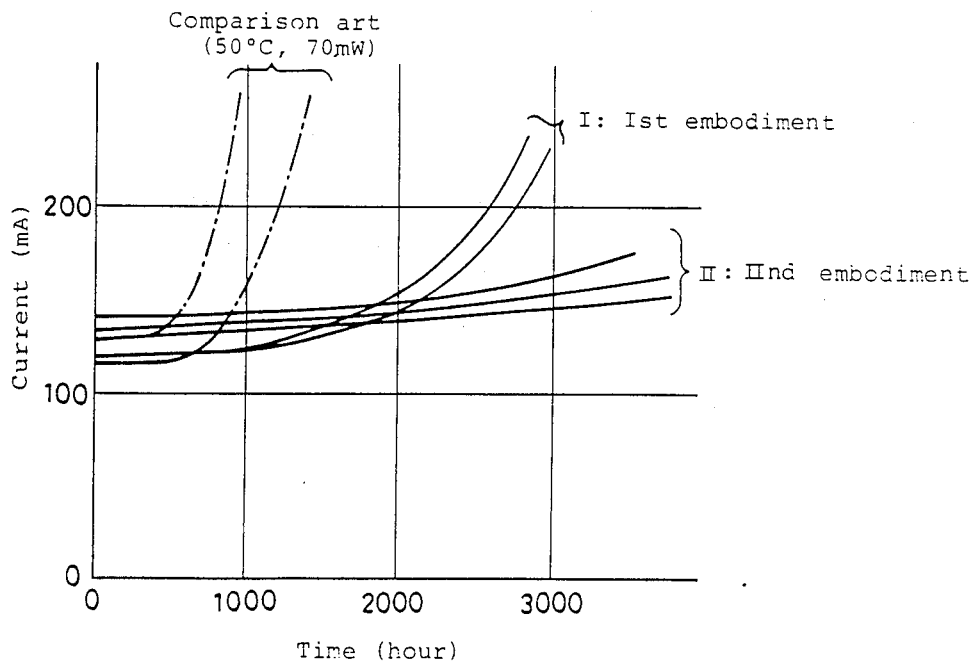

FIG. 7 is a graph showing characteristics of changes of input currents vs. lapse of time during continued laser oscillation in a constant light output operation of the embodiments and the comparison art. In the characteristics of comparison art semiconductor lasers shown by chain lines curves C, life times are short at high power output operations, while the characteristics of semiconductor lasers of the Ist and the IInd embodiment shown by the solid line curves I and II, sufficiently long life times for practical use are obtained.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. In a semiconductor laser device comprising:
   a semiconductor substrate of a first conductivity type having, on a principal face thereof, a protrusion of stripe shape, said protrusion having end faces inside of cavity facts;
   a semiconductor layer of a second conductivity type formed on said principal face, having two ridge parts which have a groove therebetween, whose bottom reaches the upper face of said protrusion at a part on said protrusion but does not reach said principal face of said semiconductor substrate and said groove remains in said first semiconductor layer except on said part on said protrusion, said groove being parallel to and over said protrusion;
   a plurality of layers disposed one on another formed on said ridges and on said groove, said plurality of layers including at least one active layer, a first cladding layer of said first conductivity type formed below said active layer, and a second cladding layer of said second conductivity type, formed above said active layer;
   a first electrode formed on an uppermost layer of said plural layers; and
   a second electrode formed on the other face of said semiconductor substrate.

2. A semiconductor laser device in accordance with claim 1, wherein widths of said ridges have narrowed end parts in the vicinity of both cavity facets of said semiconductor substrate.

3. A semiconductor laser device in accordance with claim 1, wherein widths of said narrowed parts of ridge are 5–10 μm at both end parts and 20–40 μm at inbetween part, and length of said narrowed parts is 10–50 μm.

4. In a semiconductor laser device comprising:
   a semiconductor substrate of a first conductivity type having a protrusion of stripe shape on a principal face thereof except the parts at the vicinity of both cavity facets;
   a first semiconductor layer of a second conductivity type formed on said principal face, having two ridge parts which have a groove therebetween, whose bottom reaches the upper face of said protrusion at a part thereof on said protrusion but does not reach said principal face of said semiconductor substrate and said groove remains in said first semiconductor layer except on said part on said protrusion, said groove being parallel to and over said protrusion, said ridges, having narrowed width parts at the vicinity of both end parts thereof;
   a plurality of layers disposed one on another formed on said ridges and on said groove, said plurality of layers including at least one active layer, a first cladding layer of said first conductivity type formed below said active layer, and a second cladding layer of said second conductivity type, said layers being formed above said active layer;
   a first electrode formed on an uppermost layer of said plural layers; and
   a second electrode formed on the other face of said semiconductor substrate.

5. A semiconductor laser device in accordance with claim 4, wherein width of each ridge at the vicinity of both cavity facets is 5–10 μm and widths of each ridge at other parts are 20–40 μm, and length of said narrowed width part being 10–50 μm.

6. In semiconductor laser device comprising:

a semiconductor substrate of a first conductivity type having, on a princpal face thereof, a protrusion of stripe shape, said protrusion having end faces inside of cavity facets thereof, a first semiconductor layer of a second conductivity type formed on said principal face, having a groove whose bottom reaches the upper face of said protrusion at a part on said protrusion but does not reach said principal face of said semiconductor substrate except on said part on the protrusion, said groove being parallel to and over said protrusion, a plurality of layers disposed one on another formed on said ridges and on said groove, said plurality of layers including at least one active layer, a first cladding layer of said first conductivity type formed below said active layer, and a second cladding layer of said second conductivity type, said layers being formed above said active layer;

a first electrode formed on an uppermost layer of said plural layers, and a second electrode formed on the other face of said semiconductor substrate.

7. In semiconductor laser device comprising:

a semiconductor substrate of a first conductivity type having protrusion of stripe shape on a principal face thereof except the part at the vicinity of both cavity facets thereof, a first semiconductor layer of a second conductivity type formed on said principal face, having two ridge parts which have a groove therebetween, whose bottom reaches the upper face of said protrusion at a part on said protrusion but does not reach said principal face of said semiconductor substrate and remain in said first semiconductor layer except on said part on the protrusion, a plurality of layers disposed one on another formed on said ridges and on said groove, said plurality of layers including at least one active layer, a first cladding layer of said first conductivity type formed below said active layer and a second cladding layer of said second conductivity type, formed above said active layer;

at least two electrodes provided to supply electric current to said active layer.

* * * * *